United States Patent [15] 3,676,569
Thompson [45] July 11, 1972

[54] INTEGRATED CIRCUIT PACKAGE

[72] Inventor: David F. Thompson, Warren, Pa.
[73] Assignee: Sylvania Electric Products, Inc.

[22] Filed: Jan. 4, 1971
[21] Appl. No.: 103,387

[52] U.S. Cl. ........................174/52 S, 174/DIG. 3, 174/50.6, 106/39 R, 106/46, 317/234 G
[51] Int. Cl. ........................H05k 5/06
[58] Field of Search ..................174/50.5, 50.6, 52 S, DIG. 3; 317/234 F, 234 G, 234 H; 106/39 R, 46

[56] References Cited

UNITED STATES PATENTS

| | | | |
|---|---|---|---|
| 3,019,116 | 1/1962 | Doucette | 106/46 |
| 3,436,451 | 4/1969 | Wasser | 174/DIG. 3 UX |
| 3,509,430 | 4/1970 | Mroz | 174/DIG. 3 UX |

*Primary Examiner*—Darrell L. Clay
*Attorney*—Norman J. O'Malley, Donald R. Castle and William H. McNeill

[57] ABSTRACT

Packages suitable for integrated circuits comprise a. a ceramic supporting element of predetermined outside dimensions consisting essentially of from about 35 percent to about 45 percent aluminum oxide and the remainder an appropriate sealing glass, the element has a substantially flat lower external surface and an internal sealing surface with a substantially centrally located indentation, b. an electrically conductive element comprising a frame portion extending around the perimeter of the package and external to the ceramic supporting element, a central pad portion in the indentation of the sealing surface of the ceramic supporting element, and a plurality of electrically conductive leads extending inwardly from the frame portion toward the central pad portion and having at least one lead connected to the pad portion and a major portion of the lower surface of the leads in contact with the sealing surface of the ceramic supporting element, c. a ceramic sealing element consisting essentially of from about 20 to about 30 percent by weight of aluminum oxide and the remainder essentially an appropriate sealing glass, the sealing element covers a substantial portion of the electrically conductive element having outside dimensions substantially the same as the outside dimension of the ceramic supporting element and containing an access port to the central pad, the port having predetermined dimensions, a lower sealing surface that forms a seal over a substantial portion of the leads and to the sealing surface of the supporting element and an upper substantially flat external surface, d. a metallic washer having an inside configuration substantially the same as the access port and in alignment therewith and the lower surface of the washer adhered to the external surface of the sealing element.

5 Claims, 2 Drawing Figures

INVENTOR.
DAVID F. THOMPSON
BY
Donald R. Castle
ATTORNEY

INTEGRATED CIRCUIT PACKAGE

BACKGROUND OF THE INVENTION

1. Field of the Invention

This invention relates to hermetically sealed package suitable for integrated circuits. More particularly, it relates to packages that minimize many of the problems associated with prior art packages by utilizing two different ceramic compositions for sealing and supporting.

2. Prior Art

Integrated circuit packages are hermetically sealed by utilizing a ceramic portion to seal the electrically conductive elements. The packages heretofore produced by providing the ceramic raw materials in a form of predetermined dimensions covering a predetermined portion of a lead frame. Upon heat treatment a ceramic portion was formed thereby sealing the desired parts of the lead frame inside the ceramic portion. The frame portion was thereafter removed, an integrated component was inserted therein and provisions were made so that the IC component was sealed inside the ceramic. After the package was formed the frame portion was removed and the package was thereby ready for use to form the desired circuit. The steps of insertions of the IC component and subsequent thereto are generally made by the IC manufacturer and not necessarily done by the package manufacturer.

One of the problems that occurred when prior art processes were used was that if the "raw" ceramic flowed sufficiently to form a good seal, there was insufficient strength in the finished ceramic. Conversely, if a "raw" ceramic was chosen having an increased strength after heating, then there was a resistance to flow, thus causing sealing problems.

In each instance, whether it is this invention or the prior art, it is necessary that the sealing ceramic have a thermal coefficient of expansion compatible with the electrically conductive element over the temperature range of from about room temperature to about 450° C. since sizeable differences in thermal coefficients of expansion would result in damage to the sealed package.

It is believed, therefore, that a package suitable for use in integrated circuits that have improved structural properties while providing an improved hermetic seal is an advancement in the art.

OBJECTS AND SUMMARY OF THE INVENTION

It is an object of this invention to provide an improved package suitable for integrated circuits.

It is an additional object of this invention to provide a hermetically sealed package with improved structural properties.

These objects are achieved in one aspect of this invention that provides a package comprising a lower or supporting ceramic element consisting essentially of 35 to about 45 weight percent of aluminum oxide, preferably from about 37 to about 41 percent by weight, and the remainder a compatible sealing glass thereby providing a structurally stronger support for the conduction leads and the central pad. The electrically conductive portion comprises in addition to the foregoing pad and leads, a frame that extends around the perimeter of the package. The leads extend inward toward the central pad portion and at least one lead is connected to the pad. An upper or sealing ceramic portion consisting essentially of from about 20 percent to about 30 percent by weight of aluminum oxide with from about 23 to about 27 percent being preferred, and the remainder a compatible glass that provides the hermetic seal in conjunction with the internal surface of the supporting ceramic and the requisite opening for ultimate insertion of the component into the package. The lower surface of the upper ceramic serves as the sealing surface. A metal washer adheres to the upper or external surface of the sealing ceramic element and is in alignment with the opening to provide a surface for sealing a lid after assembly of the component.

DESCRIPTION OF THE PREFERRED EMBODIMENTS

Figure 1:
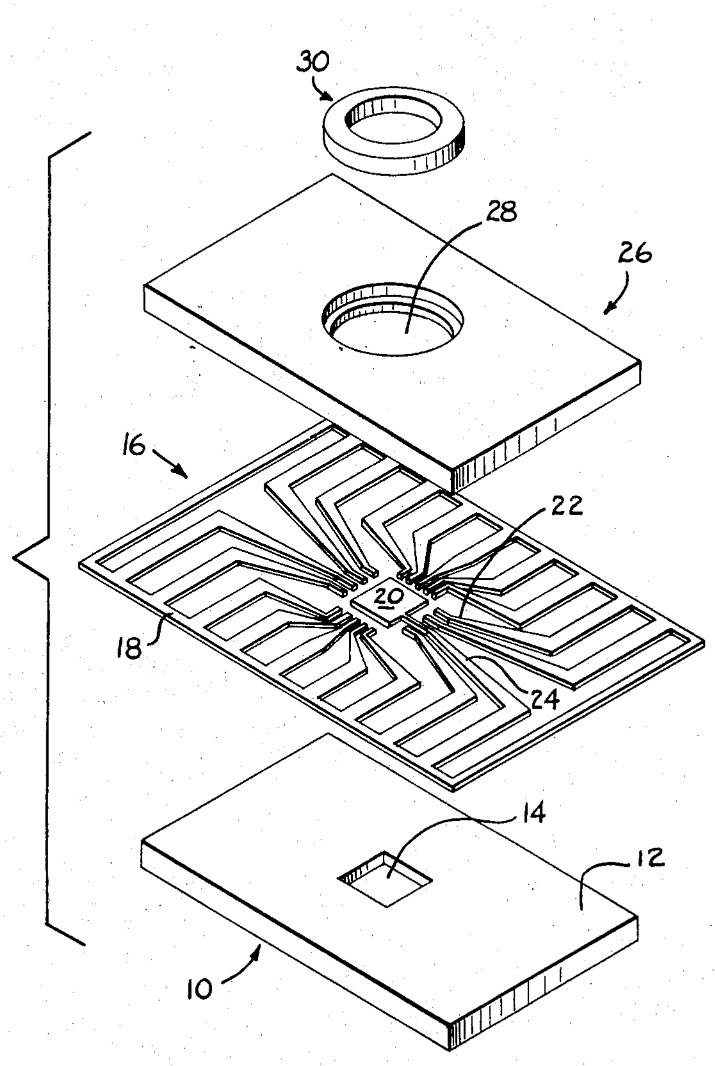
FIG. 1 is an exploded view of the components of the package of this invention.

For a better understanding of the present invention, together with other and further objects, advantages and capabilities thereof, reference is made to the following disclosure and appended claims in connection with the above-described drawings.

As previously mentioned, the lower ceramic supporting element has a relatively high alumina ($Al_2O_3$) content. A sealing glass is a major constituent of the element with a relatively large amount of alumina added. The particular glass used will be dependent upon the material of construction used in the electrically conductive element. A sealing glass having a compatible coefficient of thermal expansion is selected. In most instances a borosilicate glass is satisfactory such as the various Kovar or Rodar sealing glasses that generally contain from about 65 percent to about 70 percent by weight silica, from about 15 percent to about 25 percent $B_2O_3$ and small amounts generally below 10% and normally below 5 percent of $Al_2O_3$, $Li_2O$, $Na_2O$, $K_2O$ and BaO. A typical suitable glass when Rodar or Kovar is used as the electrically conductive element is a glass currently sold by Corning Glass Works under the designation Code 7052. When other materials are used for the electrically conductive element a suitable sealing glass can be selected by one skilled in the art. Volume 10 of Kirk and Othmer Encyclopedia of Chemical Technology, Interscience Publisher, under "Glass" can be consulted for various suitable sealing glasses.

A relative uniform mixture of the appropriate glass is formed. The glass is generally milled to less than 325 mesh, thereafter ball milled with sufficient alumina to yield a mixture having from about 35 percent to about 45 percent by weight of alumina having a similar particle size. Generally, water and a suitable binder is added and the resultant slurry is spray dried. The slurry-spray drying method affords a simple method of obtaining a relatively homogeneous mixture of the alumina and the glass although other methods can be used. The resulting powder is pressed under a sufficient pressure, e.g., about 15,000 pounds per square inch, to a form shaped article having a size about 10 to 15 percent greater than the desired size for the supporting element. It is then heated to about 700° C. to pre-fire and form an element having structural stability to enable subsequent fabrication and firing at from about 900° to about 1,100° C. to form the package. The material after firing has a strength about 50 percent greater than the materials heretofore used having an alumina content of about 25 percent and 75 percent glass as measured by the respective modulus of rupture under standard testing methods for glass. The flow of the lower supporting element during the higher temperature heating is essentially zero.

The upper or sealing element is formed by forming a composition, casting and pre-firing in substantially the same manner as the lower element except that the composition is from about 20 percent to about 30 percent alumina and from about 70 percent to about 80 percent of a similar sealing glass, and a different configuration is used. While the strength of the material as fired to form the package is substantially reduced, the material flows well and forms a satisfactory seal thus maintaining lead alignment. The practice of this invention offers several advantages in subsequent package manufacture. If all the leads but one lead are severed from the central pad after package assembly the leads do not become imbedded in the lower or supporting element thereby enabling easier severing. If leads are severed from the pad before package assembly, the resistance to flow of the supporting member apparently reduces misalignment since the higher alumina content does not tend to displace the severed leads from their desired location as was the case when lower alumina content supporting elements were used because of their greater tendency to flow.

Referring to the drawings in greater particularity, in FIG. 1 the lower ceramic or glass-ceramic supporting element 10 in a pre-fired condition is shown. The sealing surface 12 is substantially flat with the substantially centrally located indentation 14. The supporting element 10 has a relatively high alumina content thereby giving the package after firing substantially greater strength. The electrically conductive element 16 with the frame portion 18 that extends around the perimeter thereof and has larger outside dimension than the ceramic supporting element 10. The central pad portion 20 will fit into the indentation 14. A plurality of conductive leads of which one 22 is typical extend inwardly from the frame portion 18. One of the leads 24 is left connected to the pad 20. The ceramic or glass-ceramic sealing element 26 having substantially the same outside dimensions as the supporting element 10 is placed over the electrical conductive element 16. An access port 28 is provided to enable subsequent insertion of the integrated circuit component (not shown). A metallic washer 30 is placed over the access port to provide a surface to which a metal lid can be applied after the insertion of the IC component. After assembly the package is heated to form a ceramic having a compatible coefficient of expansion to that of the electrically conductive elements. During the heating the sealing ceramic element 26 flows and a hermetic seal is provided that covers a major portion of the electrically conductive leads.

Figure 2:
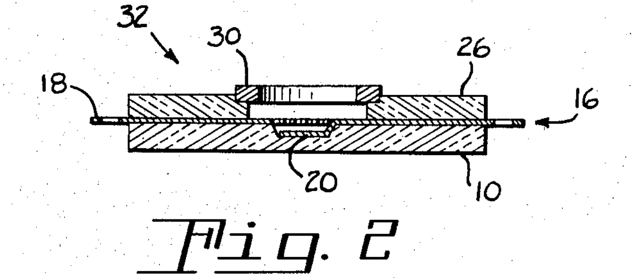
FIG. 2 is a side sectional view of the assembled package of this invention.

Referring now to FIG. 2, with greater particularity, the package, generally designated as 32, is shown after firing. The metallic washer 30 is shown as sealed to the upper ceramic element 26. The frame portion 16 extends outside the supporting element 10 and the sealing element 26. The central pad 20 fits into the indentation in the supporting element 10. The package can then be shipped for insertion of the IC component, sealing and severing of the frame portion.

While there have been shown and described what are at present considered the preferred embodiments of the invention, it will be obvious to those skilled in the art that various changes and modifications may be made therein without departing from the scope of the invention as defined by the appended claims.

What is claimed is:

1. A package for integrated circuits comprising a. a ceramic supporting element of predetermined outside dimensions consisting essentially of from about 35 to about 45 weight percent of aluminum oxide and the remainder a compatible sealing glass and having a flat lower external surface and an internal sealing surface with a substantially centrally located indentation, b. an electrically conductive element comprising a frame portion extending around the perimeter of the package and external to said supporting element, a central pad portion in the indentation of said supporting element and a plurality of electrically conductive leads extending inwardly from the frame portion toward the central pad portion and having one lead connected to said pad portion and a major portion of said leads in contact with the said sealing surface of said supporting element, c. a ceramic sealing element consisting essentially of from about 20 percent to about 30 percent by weight of aluminum oxide and the remainder a compatible sealing glass, said sealing element having essentially the same outside dimensions as said supporting element, and an access port to the central pad and a lower sealing surface that forms a seal over a substantial portion of the leads and to said sealing surface of said supporting element and d. a metallic washer having an inside configuration substantially the same and in alignment with said access port and sealed to said upper surface of said sealing element.

2. A package according to claim 1 wherein said ceramic supporting element has an aluminum oxide content of from about 37 percent to about 41 percent by weight.

3. A package according to claim 1 wherein said ceramic sealing element has an aluminum oxide content of from about 23 percent to about 27 percent by weight.

4. A package according to claim 3 wherein said ceramic supporting element has an aluminum oxide content of from about 37 percent to about 41 percent by weight.

5. A package according to claim 4 wherein said sealing glass contains from about 65 percent to about 70 percent silica and from about 15 percent to about 25 percent boron oxide.

* * * * *